United States Patent
Ke et al.

[11] Patent Number: 5,989,349
[45] Date of Patent: Nov. 23, 1999

[54] DIAGNOSTIC PEDESTAL ASSEMBLY FOR A SEMICONDUCTOR WAFER PROCESSING SYSTEM

[75] Inventors: Kuang-Han Ke, Mountain View; Roger A. Lindley, Santa Clara; Hongching Shan, San Jose; Richard R. Mett, Santa Clara, all of Calif.

[73] Assignee: Applied Materials, Inc., Santa Clara, Calif.

[21] Appl. No.: 08/881,601

[22] Filed: Jun. 24, 1997

[51] Int. Cl.⁶ .................................................. C23C 16/00
[52] U.S. Cl. ................. 118/728; 118/723 R; 118/723 E; 156/345
[58] Field of Search .................. 118/723 E, 723 ER, 118/723 R, 728, 500; 156/345

[56] References Cited

U.S. PATENT DOCUMENTS

| | | | |
|---|---|---|---|
| 5,451,784 | 9/1995 | Loewenhardt et al. | 250/305 |
| 5,667,701 | 9/1997 | Sato et al. | 216/61 |
| 5,885,402 | 3/1999 | Esquibel | 156/345 |
| 5,906,684 | 5/1999 | Tamura et al. | 118/728 |

*Primary Examiner*—R. Brian Breneman
*Assistant Examiner*—Luz Alejandro
*Attorney, Agent, or Firm*—Thomason, Moser, Patterson

[57] ABSTRACT

A diagnostic pedestal assembly for measuring ion current and DC bias voltage within a high-power plasma reaction chamber of a semiconductor wafer processing system. The diagnostic pedestal assembly contains an aperture located in a surface of the pedestal and a probe element that is supported within the aperture.

41 Claims, 7 Drawing Sheets

DIAGNOSTIC PEDESTAL ASSEMBLY FOR A SEMICONDUCTOR WAFER PROCESSING SYSTEM

BACKGROUND OF THE DISCLOSURE

1. Field of the Invention

The present invention relates to semiconductor wafer processing equipment and, more particularly, to a diagnostic pedestal assembly for measuring ion current uniformity and DC bias uniformity within a reaction chamber of such equipment.

2. Description of the Background Art

Ion flux and wafer bias voltage are important parameters of a plasma contained by a reaction chamber within a semiconductor wafer processing system. These parameters indicate the effectiveness of the semiconductor wafer processing system to process a wafer uniformly across the wafer. Specifically, the ion flux and wafer bias voltage affect the uniformity of an etch process (as well as deposition uniformity in chemical vapor deposition (CVD) and physical vapor deposition (PVD) processes) and indicate the potential for damage to a wafer due to a non-uniform plasma. Since these parameters are so important to the etch and/or deposition process, the measurement of both ion current and wafer bias voltage at a given location within the chamber is important to characterizing the effectiveness of the plasma in processing the wafer.

Typically, to measure ion current, an ion current probe, similar to a Langmuir probe, is used. To measure the distribution of current at the surface of a wafer, one or more current probes are affixed to one surface of a placebo wafer, i.e., a silicon disk having the same size and shape as a semiconductor wafer. The placebo wafer is then positioned within a semiconductor processing system in a similar location as a semiconductor wafer would typically be located. Once a plasma is generated by the processing system, the ion current probes are biased negatively to collect ions from the plasma. Consequently, an electric current is produced in a wire attaching the probe to a current meter. The measured current is indicative of the number of ions incident upon the current probe at that location on the placebo wafer. By judiciously positioning the current probes in an array on the surface of the placebo wafer, the ion currents measured at each individual current probe are combined to estimate the ion current distribution over the surface of the placebo wafer. This current distribution is indicative of the ion flux within the plasma.

To measure DC bias voltage, the conductive probes are unbiased, RF filtered and are each coupled to a volt meter. The measured voltage is indicative of the DC bias voltage on the surface of the wafer at the particular locations of the probes. Judicious placement of the voltage probes in an array on the surface of the placebo wafer provides an estimate of the DC bias voltage distribution over the surface of the placebo wafer.

Although the use of a placebo wafer carrying a plurality of diagnostic probes is very useful in monitoring and measuring a plasma within a reaction chamber, experience has shown that a placebo wafer having surface mounted current and voltage probes is not a useful diagnostic tool to characterize a plasma within a high-cathode-powered reaction chamber i.e., a chamber having a substantial amount of power coupled to the plasma from the cathode. One problem associated with placebo wafer utilization in a high-cathode-powered chamber is the significant degree of arcing that occurs due to voltage differentials created on various components of the diagnostic wafer. Such arcing is detrimental to the diagnostic wafer, the measurement equipment and the semiconductor wafer processing equipment itself.

Therefore, a need exists in the art for apparatus that measures ion flux uniformity and DC bias uniformity in a high-cathode-powered reaction chamber of a semiconductor wafer processing system.

SUMMARY OF THE INVENTION

The disadvantages heretofore associated with the prior art are overcome by the present invention of apparatus for measuring ion current and DC bias voltage within a high-cathode-powered reaction chamber of a semiconductor wafer processing system. Specifically, the present invention is a diagnostic cathode assembly containing, within the surface of a pedestal, at least one probe element, and preferably, a plurality of probe elements arranged in an array. More specifically, the diagnostic cathode assembly comprises a diagnostic pedestal assembly, an electronics bay, and a housing. The pedestal assembly contains a conductive pedestal containing a plurality of bores at each location where a diagnostic probe is located. Within each bore is a conductive probe element having a surface that is mounted flush with the pedestal surface. The probe element is circumscribed by a dielectric plug having a surface that is flush with the tip of the probe as well as the pedestal surface. Each dielectric plug extends into a respective bore in the pedestal and is affixed to a probe mount that extends from a first insulator layer. Each plug is screwed into an associated probe mount, where each probe mount is cylindrical in shape and is circumscribed by a conformal O-ring which, when the assembly is complete, abuts the bottom of the pedestal such that a vacuum seal is created between the insulator layer and the pedestal. In this manner, the first insulator layer is not exposed to the plasma.

The diagnostic probe elements extend through the first insulator layer and are circumscribed at a distal end by a second O-ring forming an axial seal. A second insulator layer is positioned behind the first insulator layer to maintain the probes within the dielectric plug such that the end of the probe is coplanar with the surface of the pedestal. The first insulator layer also contains channels for routing cables from the probe elements to particular cable guides within the cathode assembly. A backing plate mounts to the back of the second insulator plate and screws pass through the first and second insulator plate as well as the backing plate into the bottom surface of the pedestal to complete the assembly of a diagnostic pedestal assembly. The pedestal assembly is mounted to a cooling plate of conventional design. The cable routing portions of the second insulating plate extend through the mounting plate and also through the cooling plate such that they can interface with a cable routing and interface insulator block as well as the signal pre-processing electronics. The electronics, as well as the cable routing and interface insulator block are contained within a shielded housing (an electronics bay).

Consequently, the entire diagnostic cathode assembly can be "swapped" with the cathode assembly (process cathode assembly) of a semiconductor wafer processing system. The processing system can be operated using the diagnostic cathode to collect data regarding the plasma in a similar manner to when the system processes wafers. The diagnostic cathode assembly can then be replaced with the process cathode assembly to process wafers.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
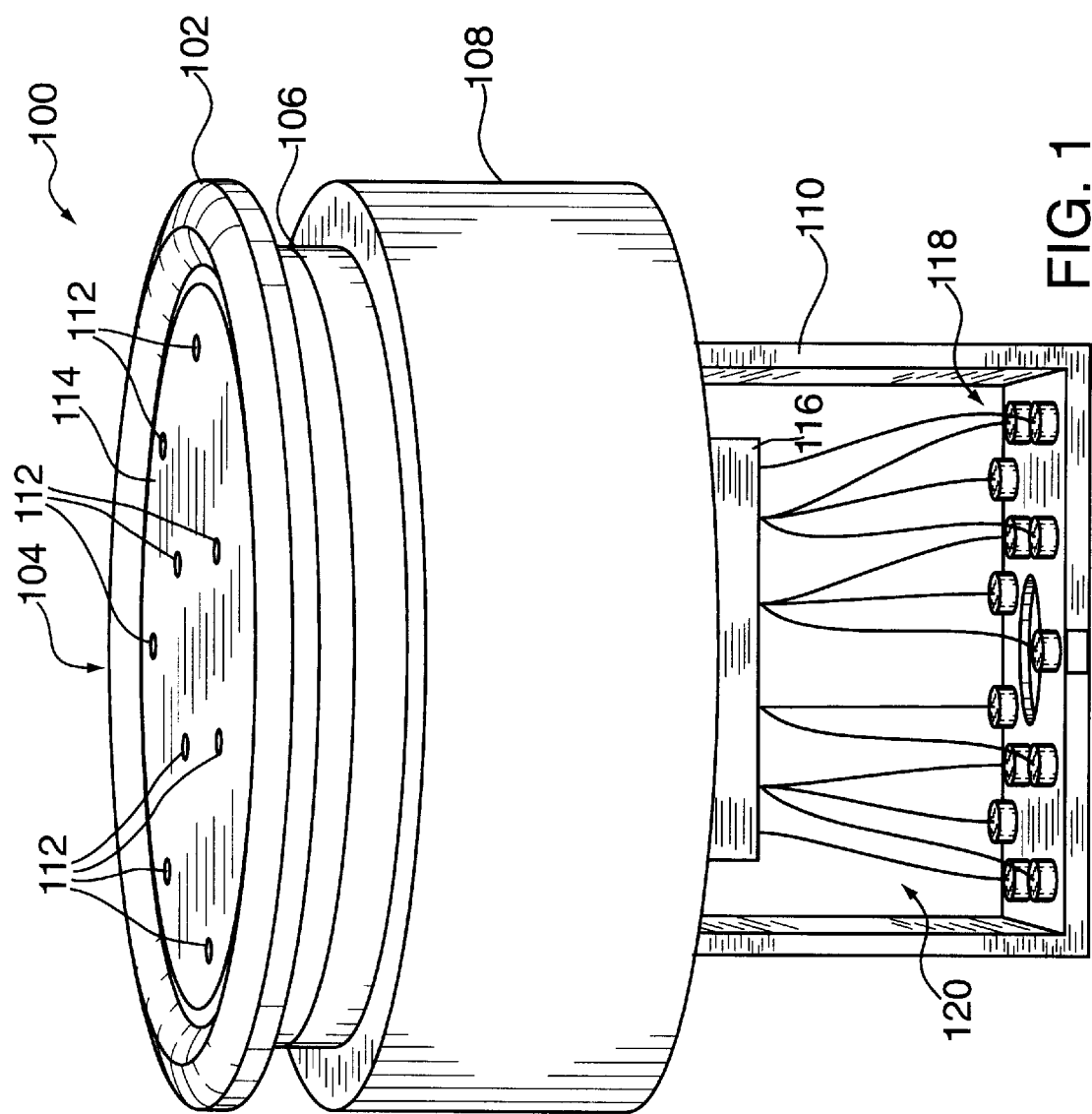
FIG. 1 depicts a perspective view of a diagnostic cathode assembly of the present invention.

FIG. 1 depicts a perspective view of a diagnostic cathode assembly 100 of the present invention. The assembly contains a process kit 102, a diagnostic pedestal assembly 104, a cooling plate 106, an upper housing 108, and a lower housing 110. FIG. 1 depicts the lower housing 110 with the front and back housing plates (not shown) removed from the housing. As such, the electronics and cabling within the lower housing can be appreciated.

Specifically, the diagnostic pedestal assembly 104 contains a plurality of probe elements 112 embedded in a wafer support surface 114 of the pedestal assembly. The top end of each probe element is generally coplanar (flush) with the surface 114 of the pedestal assembly. The pedestal assembly is circumscribed by a conventional process kit 102. The pedestal assembly 104 is affixed to a cooling plate 106 that contains fluid conduits. During use, a coolant is pumped through the cooling plate to maintain the pedestal assembly at a prescribed temperature. The upper housing 108 extends from the cooling plate and encloses signal pre-processing circuitry 116 that is connected to each of the probe elements. Additionally, the lower housing 110, a rectangular box that is affixed to the bottom of the upper housing to form an electronics bay, encloses the cables 120 and electrical connectors 118 that couple signals from the probe elements to signal analysis equipment (not shown). The upper and lower housings are fabricated from conductive material (e.g., aluminum) which forms a shield for the electronics and cabling.

The overall form of the diagnostic cathode assembly 100 is identical in size to a process cathode assembly it replaces in a semiconductor wafer processing system. As such, the diagnostic cathode assembly of the present invention is used by replacing the conventional process cathode and pedestal assembly of a semiconductor wafer processing system. The diagnostic cathode assembly is positioned and used to evaluate the plasma within a reaction chamber as well as provide feedback which can be used to optimize the plasma within the chamber. Subsequently, the diagnostic cathode assembly is removed and the conventional process cathode assembly is positioned within the chamber to facilitate wafer processing. As such, the diagnostic pedestal has a form that permits easy and rapid replacement within a reaction chamber. Furthermore, to insure that the diagnostic pedestal accurately measures the ion flux and the DC bias uniformity, as would be experienced by a wafer within the reaction chamber during processing, the pedestal surface, as well as its mounting flange and overall form, is substantially similar to the process pedestal assembly used during wafer processing.

Figure 2:
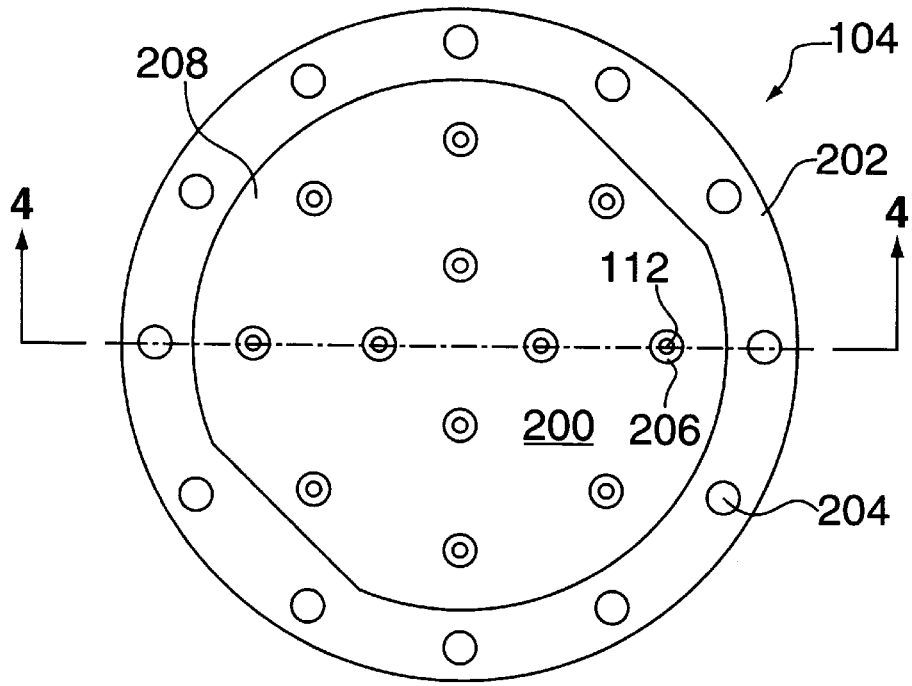
FIG. 2 depicts a top plan view of a diagnostic pedestal assembly.
Figure 3:
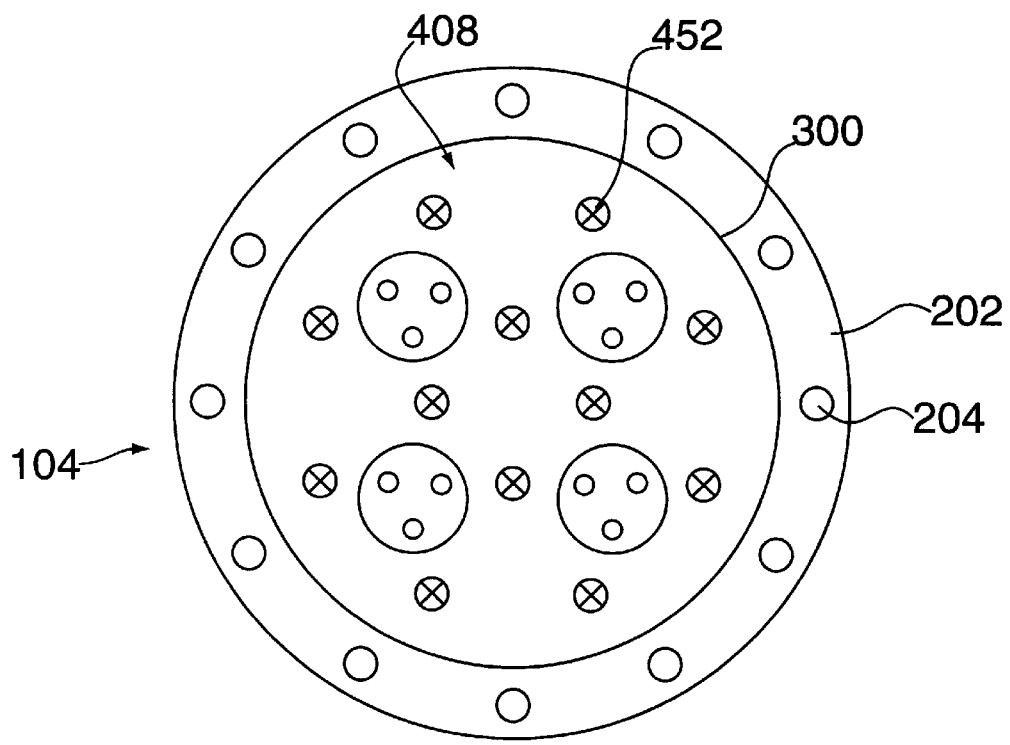
FIG. 3 depicts a bottom plan view of the diagnostic pedestal assembly of FIG. 1.
Figure 4:
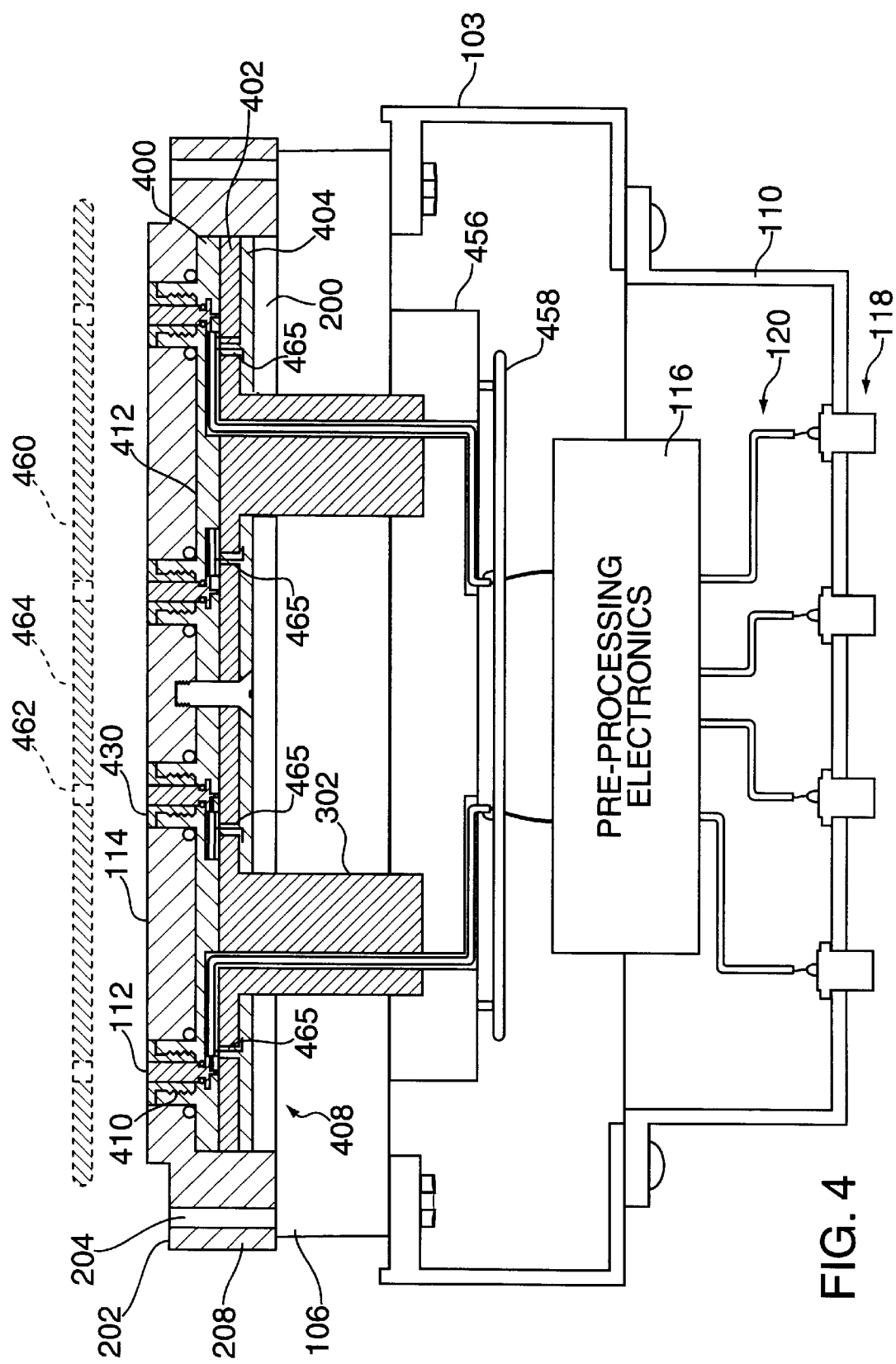
FIG. 4 depicts a cross-sectional view of the diagnostic pedestal assembly taken along line 4—4 of FIG. 2.
Figure 5:
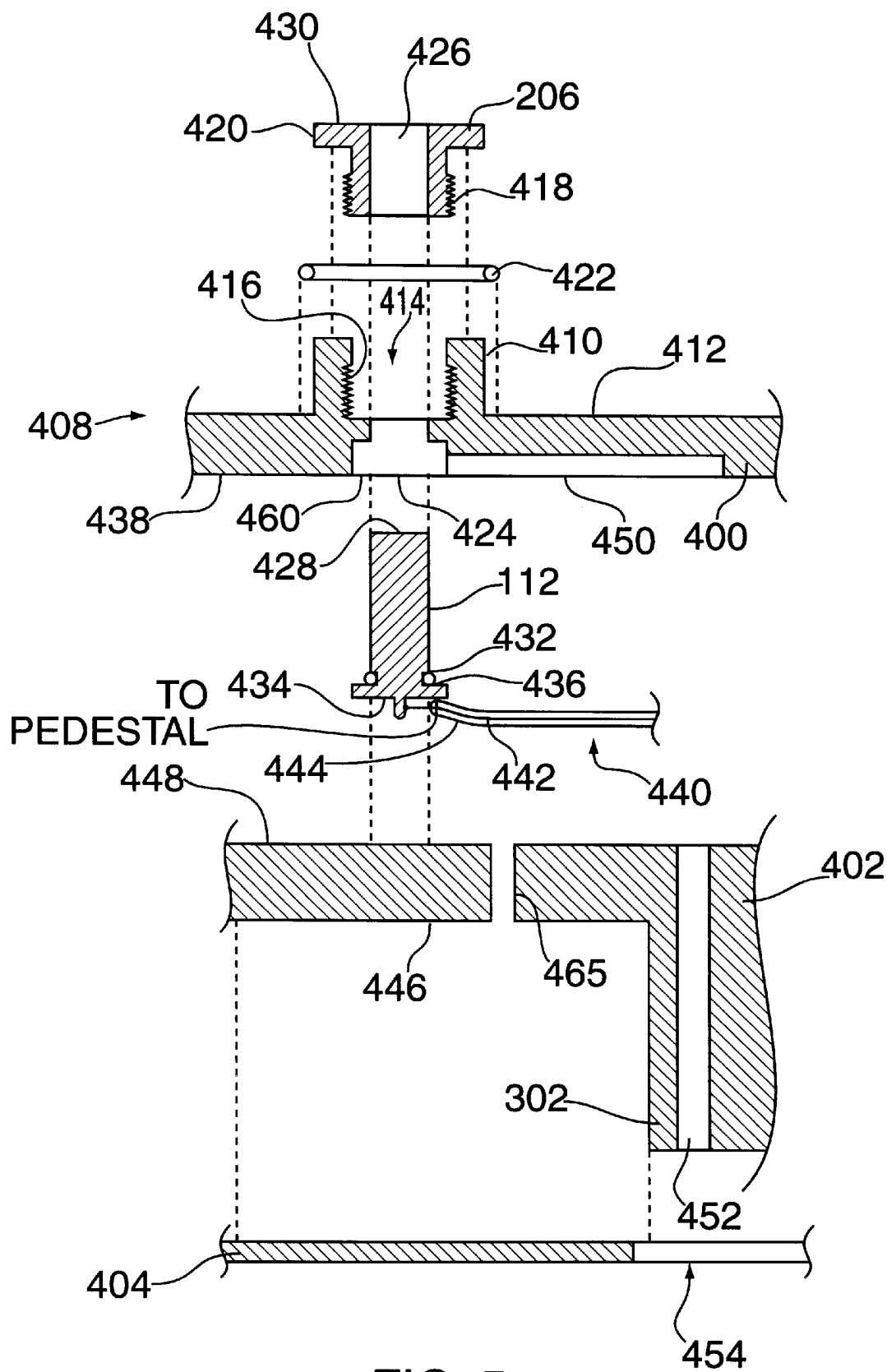
FIG. 5 depicts a detailed exploded cross-sectional view of a portion of the diagnostic pedestal assembly showing the details of a probe element.

FIG. 2 depicts a top plan view of the diagnostic pedestal assembly 104 of the present invention, FIG. 3 depicts a bottom plan view of the diagnostic pedestal assembly, FIG. 4 depicts a cross-sectional view of the diagnostic pedestal assembly taken along line 4—4 of FIG. 2, and FIG. 5 depicts a detailed, exploded cross-sectional view of an individual probe in accordance with the present invention. To best understand the invention, the reader should simultaneously refer to FIGS. 2, 3, 4 and 5.

Specifically, the diagnostic pedestal assembly 104 contains a conductive pedestal 208 and a probe assembly 408. The pedestal has a centrally located wafer support surface 114 that is circumscribed by a mounting flange 202 containing a plurality of bolt holes 204 to facilitate mounting the pedestal assembly to a conventional cooling plate 106. The wafer support surface 114 of the pedestal contains a plurality of probe elements 112. The surface of each of these probes is coplanar with the surface of the pedestal. Preferably, the probe elements 112 are arranged in an array and distributed uniformly across the support surface of the pedestal. Illustratively, the pedestal assembly of FIG. 1 depicts twelve probe elements uniformly distributed across the pedestal surface. However, it should be understood that any arrangement of probes is within the scope of this invention. Other arrangements may include, but are not limited to, a single line (row) of probes, two lines of probes at a certain angle to one another (e.g., 30, 60 or 90 degrees), a single circle of probes and the like.

More specifically, the probe assembly 408 contains a plurality of conductive probe elements 112, a plurality of dielectric plugs 206 which circumscribe each of the probe elements 112, a first insulating plate 400, a second insulating plate 402, and a backing plate 404. The bottom surface of the pedestal 208 is milled to form a circular cavity 300 within which the probe assembly 408 is positioned. The probe assembly 408 contains a first insulating plate 400 having a plurality of probe mounts 410 which extend from the top surface 412 of the first insulating plate. The first insulating plate is fabricated from an insulative material such as ULTEM. Each probe mount 410 is cylindrical in form, having a central bore 414 containing threads 416. The threads 416 interfit the threads 418 on the outer surface of the dielectric plug 206. As such, each dielectric plug 206 screws into a probe mount 410 until the surface 430 is level (coplanar) with the top surface 428 of the probe 112. The dielectric plugs are fabricated of a plasma resistant ceramic such as alumina. An O-ring 422 is positioned about each of the probe mounts to provide a vacuum seal between the reaction chamber and atmosphere. Any gaps between the probed tip and the dielectric plug, and the dielectric plug and the pedestal must be small enough to prevent plasma from penetrating the probe assembly. Such penetration would be detrimental to the insulator materials and the O-rings. Consequently, the gaps should be less than 0.15 mm.

A cylindrical probe element 112 is inserted through a bore 424 in the first insulator plate 400 as well as through a cylindrical bore 426 in the dielectric plug 206. The bore 424 and 426 are both coaxially aligned with the probe mount 410. A top (first) end 428 of the probe element 112 is flush with (coplanar with) the top surface 430 of the dielectric plug 206 as well as the top surface 114 of the pedestal 202. To achieve this coplanar relationship, a dielectric plug can be rotated clockwise or counter-clockwise within its threaded probe mount to raise or lower the plug's surface relative to the pedestal surface.

An annular indentation 432 proximate the bottom (second) end 434 of the probe element 112 retains a circular O-ring 436. To form an axial seal, the probe element 112 is inserted into the first insulating plate 400 causes the O-ring 436 to abut an O-ring seat 460 located in the bottom surface 438 of the first insulating plate 400.

Soldered to the second end 434 of the probe element 112 is a coaxial cable 440, such as RG/U 178B. Specifically, the center conductor 442 of the coaxial cable 440 is connected to the second end 434 of the probe element 112, and the shield 444 of the coaxial cable 440 is connected to an RF "hot" surface. Specifically, the shield is passed through a bore 465 through the second insulator plate 402. The distal end of the shield contacts the backing plate 402, i.e., is sandwiched between the backing plate 402 and the second insulator plate 404.

The second insulating plate 402 is circular in plan form with a diameter that is less than the diameter of pedestal cavity 300. The plate 402 has four cable routing extensions 302 which protrude from the backside 446 of the plate 402. The bottom surface 438 of the first insulating plate 400 contains a plurality of cable routing troughs 450 that route the coaxial cables 440 toward the extensions 302 and maintained the cables in a stationary position. Each cable is threaded through a bore 452 which extends from the top surface 448 of the second insulating plate 402 through the cable routing extension 302. As such, each cable has an associated trough 450 that leads to a bore 452. This arrangement maintains the cables in a spaced-apart relation that limits signal crosstalk and noise variations due to cable movement. Preferably, each of the cables connected to each of the probe elements has the exact same length in order to maintain equal capacitances between the coaxial cable and the pedestal, which maintains equal RF coupling between the coaxial cable and the RF generator. This, in turn, allows for substantially reduced signal-to-signal variation in measured signals when a plasma is uniform within the chamber.

A metal backing plate 404 is affixed to the backside 446 of the second insulating plate 402 by a plurality of screws 452. This backing plate 409 compresses the O-ring 422 between the first insulating plate and the pedestal. Additionally, the backing plate secures the distal end of the coaxial cable shield between the backing plate and the second insulator layer. The backing plate 404 contains a plurality, e.g., four, large bores 454, through which the cable routing extensions 302 protrude. Typically, there are four cable routing extensions, each of which contains three cable routing bores. A plurality of screws, e.g., twelve, are used to affix the backing plate 404 to the pedestal 202. The number of screws is large to uniformly distribute the force and uniformly compress the O-rings 422. By uniformly screwing the backing plate 404 to the pedestal, each of the probes has a tip (end 428) that is coplanar with the pedestal surface 200. As mentioned above, the dielectric plugs can be adjusted to make each of the tips coplanar with their respective dielectric plugs.

The cable routing extensions 302 are positioned such that they extend through existing holes (e.g., lift pin access holes) in a conventional cooling plate 106. In a conventional manner, the pedestal assembly is peripherally bolted to the cooling plate 106. The plate provides cooling to the pedestal assembly during processing. As such, the diagnostic pedestal assembly is maintained at the same temperature as the process pedestal when used in actual wafer processing.

As shown in FIG. 4 only, a cable routing and interface insulator block 456 is attached to the back side of the cooling plate 106 and interfaces with the cable routing extensions 302. The cable routing and interface insulator block 456 insures proper spacing of the cables to reduce signal interference. The block 456 also provides a mount for a common bus 458 for attaching all of the shields 444 of the coaxial cables 440. The common bus 458 is then connected to the RF source that powers the cathode. As such, the shield 444 of each cable 440 is connected to the RF signal at each end of the cable. The center conductors 442 of the coaxial cables 440 are coupled to pre-processing electronics 116 that provides filtering and voltage division for the signals that are coupled from the probe elements. The output of the pre-processing electronics is coupled to a plurality of signal connectors 118 (e.g., BNC connectors or equivalent connectors). These connectors facilitate coupling the measured signals via shielded cabling to a signal analysis system (not shown). The pre-processing electronics is discussed in detail with reference to FIGS. 6 and 7 below.

To further simulate actual processing within a chamber while using the diagnostic cathode assembly, a cover 460 can be applied (deposited or affixed) to the surface 114 of the pedestal to simulate a wafer or other workpiece. Such a cover 460 may be fabricated of silicon, quartz, Kapton or some other dielectric material. The cover contains a plurality of apertures 462 that are coaxially aligned with each of the probe elements 112. To compensate for the thickness of the cover material and position the probes flush with the surface that is exposed to the plasma, the probe elements 112 can be designed to extend through the cover 460 such that the tip 428 of each probe is coplanar with the surface 464 of the cover 460. A cover 460 of silicon or quartz is generally 0.030 inches (0.8 mm) thick, and as such, the probe elements extend by 0.030 inches (0.8 mm) above the surface 430 of the dielectric plugs 206. Alternatively, to determine ion flux and DC bias voltage within, for example, a "via" through a wafer, the cover 460 can be fabricated with apertures that simulate the aspect ratio of a via, and those apertures can be aligned with the probe elements. As such, the probe elements measure the ion flux and the DC bias voltage within the vias.

Figure 6:
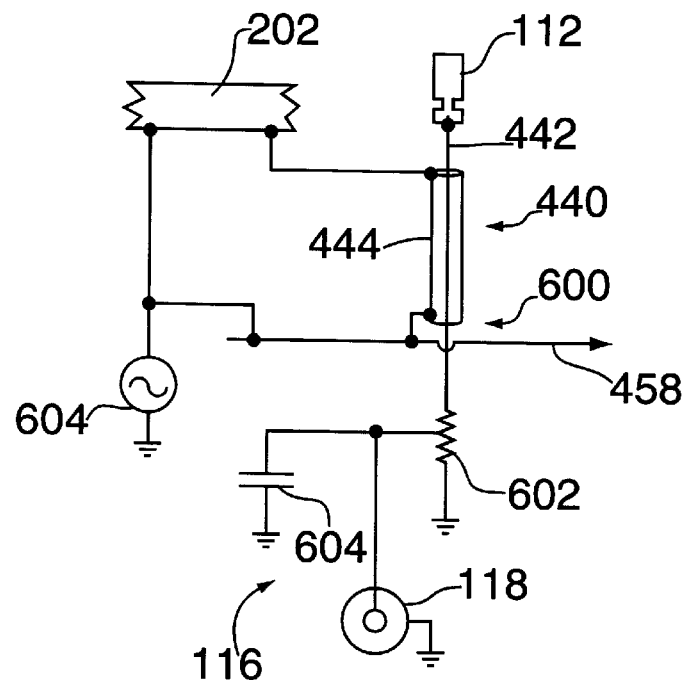
FIG. 6 depicts a schematic diagram of the pre-processing circuitry for measuring bias voltage.

FIG. 6 depicts a schematic of the pre-processing electronics 116 used for DC bias voltage measurements at one probe element 112. Specifically, the probe element 112 is connected to the center conductor 442 of the 50 ohm coaxial cable 440. The outer shield 444 at the end of the cable 440 that attaches to the probe element 112 is connected to the pedestal 202 via the backing plate. As such, the shield 444 of the cable 440 is "hot", i.e., at the same potential as the pedestal. The distal end 600 of the coaxial cable 444 is connected to a voltage divider 602, e.g., a 100 megohm resistor connected to ground having a tap that forms a 200 to 1 voltage divider. The outer shield 444 at the distal end 600 is connected to the RF power supply 604 that drives the pedestal 202. Specifically, the shields of all the cables are connected to the common bus 458 and the bus is connected to the RF power supply. The divided signal from the voltage divider 602 is coupled to a capacitor (1200 pF) 604. The capacitor is connected to ground to form a filter that attenuates RF signals (e.g., 13.56 MHz) from the DC voltage measurement signal 118. As such, the DC voltage that is generated by ion bombardment of the probe element is coupled through the connector to a signal analysis system.

Figure 7:
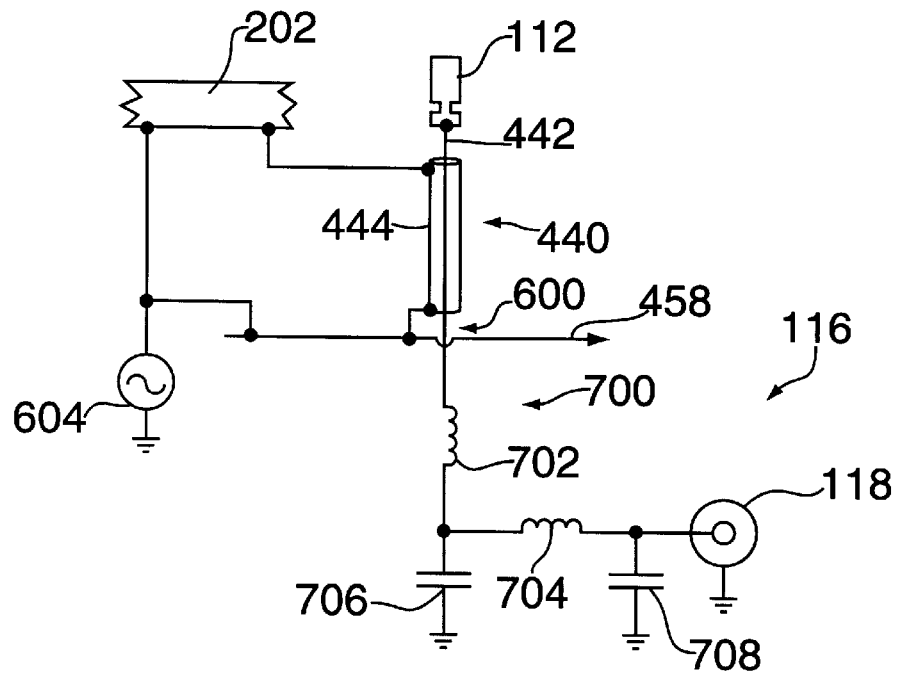
FIG. 7 depicts a schematic diagram of the pre-processing circuitry for measuring ion current.

FIG. 7 depicts a schematic diagram of the preprocessing electronics 116 used to measure ion current at one probe element. The structure of the ion current measuring circuitry is substantially similar to the circuitry used for measuring bias voltage (FIG. 6), although the voltage divider in the DC bias voltage pre-processing circuitry is replaced with a low pass filter 700.

The low pass filter 700 contains a first inductor 702 (approximately 42 $\mu$H), a second inductor 704 (approximately 150 $\mu$H), a first capacitor 706 (approximately 100 pF) and a second capacitor 708 (approximately 100 pF). The first and second inductors 702 and 704 are connected in series from the center conductor 442 of the cable 440 to the center pin of the connector 118. At the junction of the first and second inductors, the first capacitor 706 is connected from the junction to ground. At the connection of the second inductor 704 to the connector, the second capacitor 708 is connected from the center pin of the conductor 118 to ground. The low pass filter attenuates the RF voltage carried by the center conductor 442 of the cable 440. Additionally, the center conductor of the connector can be used to negatively bias the probe element to facilitate collection of ions. The connector 118 can then be connected to a diagnostic system that performs signal analysis to correlate the various signals measured by each of the probes in the array to generate an ion flux distribution. Although the foregoing circuitry is primarily designed to measure ion flux, DC bias voltage accumulated on a probe can be measured by measuring the DC voltage on the capacitors. Thus, the filter 702 may have two outputs, one for measuring ion current and one for measuring DC bias voltage.

The signal analysis system can, in general, be any display that depicts current and/or voltage magnitude. However, to best characterize the plasma, a graphical system is preferred. Such a graphical signal analysis system is disclosed in commonly assigned U.S. patent application Ser. No. 08/612,279 filed Mar. 22, 1996.

By using a graphical signal analysis system, the ion current and/or bias voltage measured at each probe location can be interpolated to produce an ion flux distribution and bias voltage distribution graphs. Using these graphs in real-time, certain plasma characteristics can be optimized such as plasma uniformity. Consequently, chamber parameters can be altered to achieve an optimal plasma distribution prior to processing wafers.

The diagnostic cathode assembly of the present invention can form a component of a comprehensive wafer processing system. Such a system contains a process chamber, a process cathode assembly, a diagnostic cathode assembly, and various support apparatus. In accordance with the present invention the process cathode assembly and diagnostic cathode assembly are relatively easily "swapped" to perform plasma diagnostics, then "reswapped" to process wafers.

Figure 8:
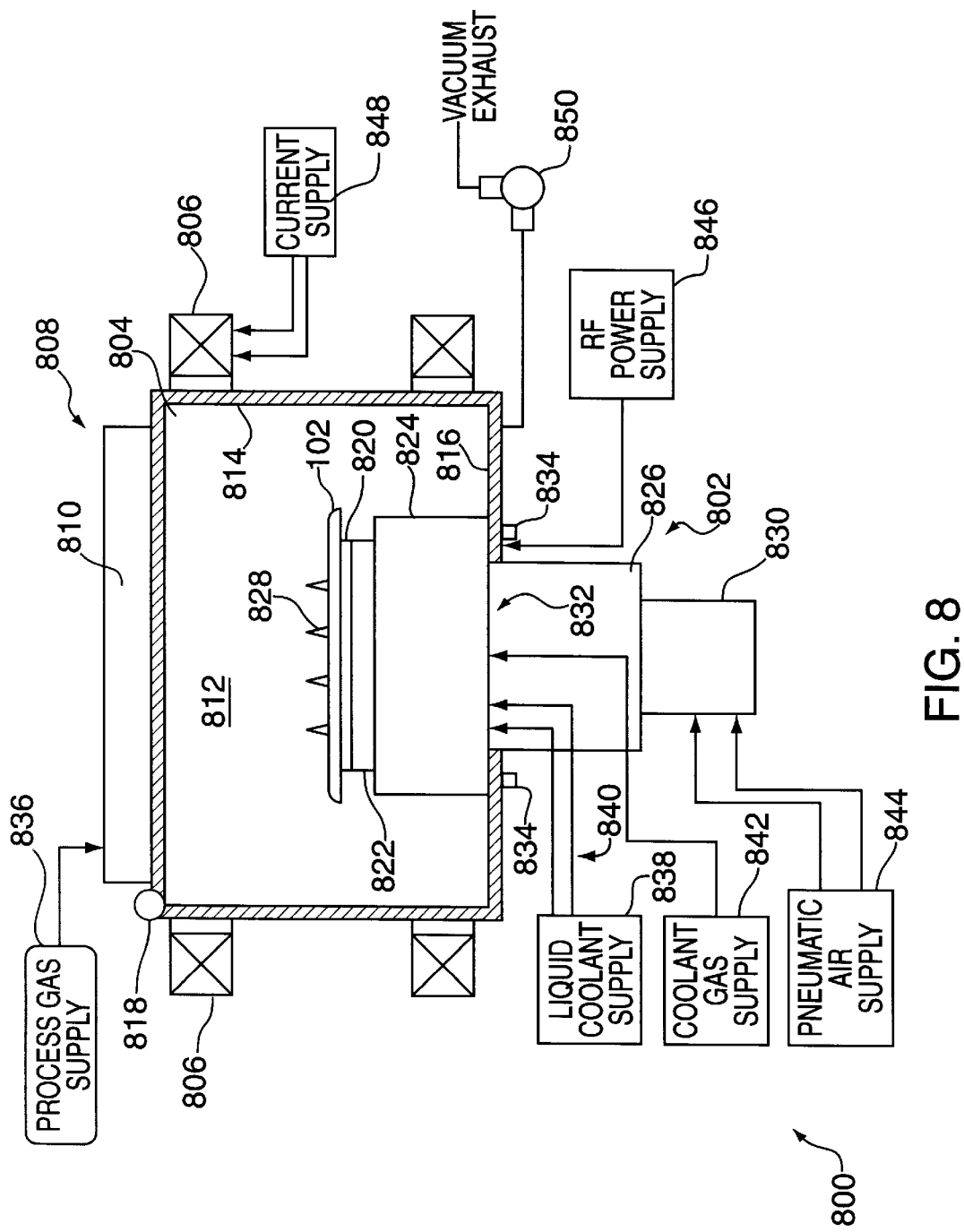
FIG. 8 depicts a semiconductor wafer processing system containing a process cathode assembly.
Figure 9:
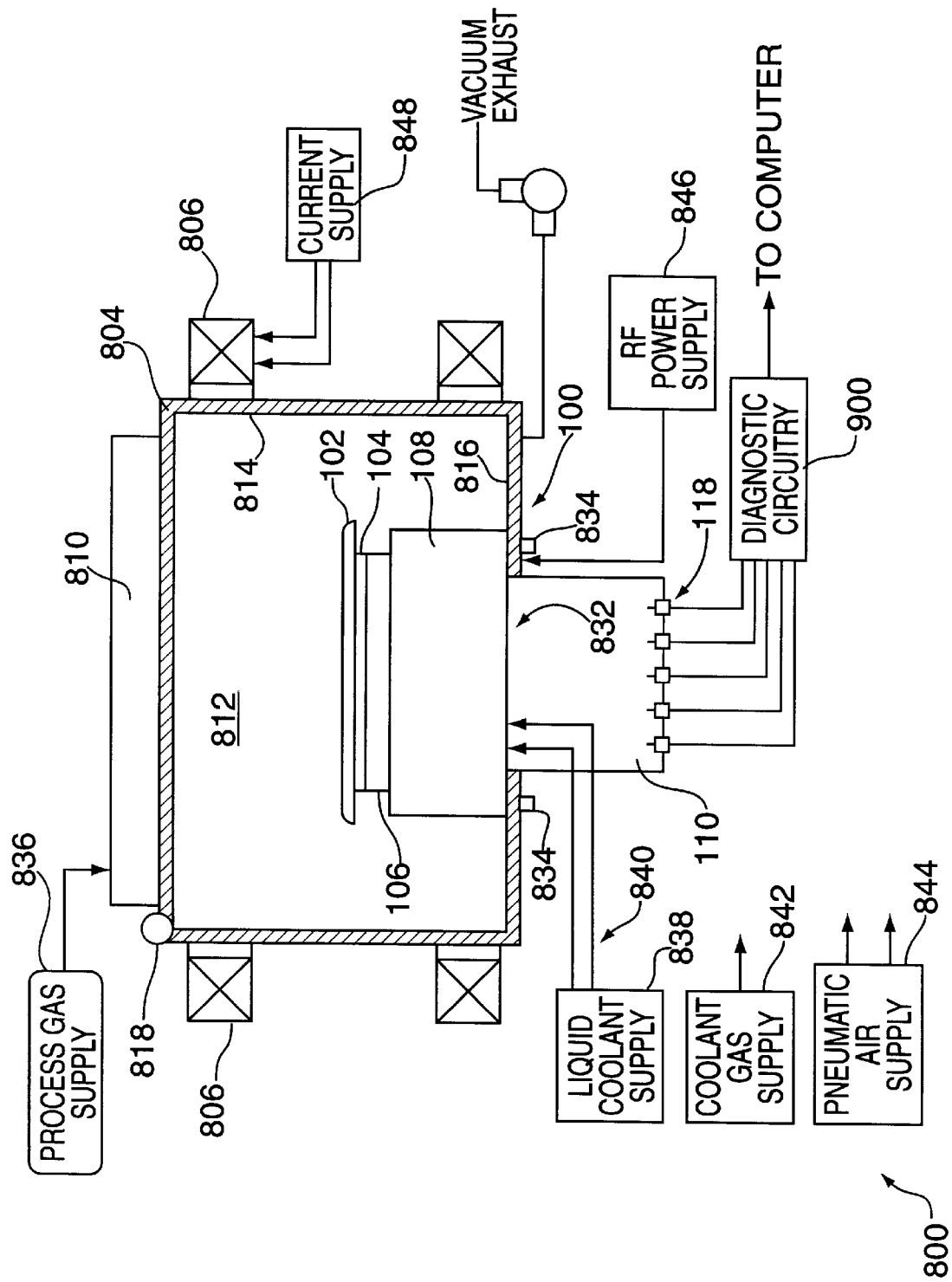
FIG. 9 depicts a semiconductor wafer processing system containing a process cathode assembly.

Specifically, FIG. 8 and FIG. 9 schematically depict a comprehensive semiconductor wafer processing system 800 of the present invention. FIG. 8 depicts the system 800 having a process cathode assembly 802 positioned within the process chamber 804, while FIG. 9 depicts diagnostic cathode assembly 100 within the process chamber 804. Although any form of process chamber can be used with the invention, FIGS. 8 and 9 illustratively depict a simplified schematic of an MxP$^+$ etch chamber manufactured by Applied Materials, Inc. of Santa Clara, Calif. For a comprehensive description of this process chamber, the reader should refer to commonly assigned U.S. Pat. No. 8,842,683, issued Jun. 27, 1989 to Cheng et al.

More specifically, the process chamber 804 contains a plurality of electromagnets 806, a lid 808 having a gas distribution plate 810 (a shower head), an interior volume 812 defined by a cylindrical wall 814, and a bottom 816. The lid 808 is generally coupled to the wall 814 by a hinge 818. As such, the lid 808 can be lifted to provide access to the volume 812 and the process cathode 802.

The process cathode assembly 802 contains a process kit 102, a process pedestal assembly 820, a cooling plate 822, an upper housing 824, a lower hosing 826, a plurality of wafer lift pins 828, and a lift pin actuator 830. To install the process cathode assembly 802, the cathode assembly 802 is lowered into the chamber volume 812 while the lid 808 is open. An aperture in the bottom 816 of the chamber 804 permits the lower housing 826 to extend from the bottom 816. The bottom edge of the upper housing 824 rests against the inner side of the chamber bottom 816. A plurality of bolts 834, e.g., six bolts, affix the cathode assembly 802 to the chamber 804.

To facilitate system 800 operation, a process gas supply 836 is connected to the gas distribution plate 810 and a vacuum pump assembly 850 is coupled to the bottom 816 of the process chamber 804. The pump removes the atmosphere from the chamber 804, creating a vacuum therein, prior to introducing the process gas to the volume 812 via plate 810. A liquid coolant supply 838 is coupled to a pair of supply hoses 840 to provide coolant to the cooling plate 822. A coolant gas supply 842, e.g., helium supply, provides a heat transfer medium to the surface of the pedestal 820. To facilitate positioning of a wafer upon the pedestal 820, a pneumatic air supply 844 provides compressed air to a pneumatic lift pin actuator 830 that selectively raises and lowers the lift pins 828. An RF power supply 846 is coupled to the cathode assembly 802 to provide RF energy that excites the reactive gas to form a plasma within the volume 812. The plasma is confined and controlled by magnetic fields generated by the peripherally arranged electromagnets 806. These electromagnets 806 are coupled to a current supply 848 that selectively drives the electromagnets 806 to control the magnetic fields generated thereby. This equipment, operating together, processes (etches) wafers in a conventional manner.

To perform plasma diagnostics to characterize the plasma in volume 812 by measuring ion flux and wafer bias voltage, the system 800 is altered by removal of the process cathode assembly 802 and installation of the diagnostic cathode assembly 900. Removing the process cathode assembly requires releasing the vacuum from the process chamber 850 and decoupling the RF power supply 846, the coolant gas supply 842, the liquid coolant supply 838 and the pneumatic air supply 844 from the process cathode assembly 802. The plurality of bolts 834 are removed from the upper housing 824, the lid 808 is lifted and the process cathode assembly is simply lifted through the top opening of the process chamber 804. Thereafter, the diagnostic cathode assembly 100 is lowered through the top opening to extend the lower housing 110 through the aperture 832 in the bottom 816 of the process chamber 804. The bottom edge of the upper housing 108 is supported by the bottom 816 of the chamber 804. The bolts 834 affix the upper housing 108 to the chamber bottom 816. The liquid coolant supply is coupled, via hoses 840, to the cooling plate 106 and the RF power supply 846 is connected to the diagnostic cathode assembly 100. The coolant gas supply 842 and the pneumatic air supply 844 are not used by the diagnostic pedestal 100. Diagnostic circuitry is coupled to the connectors 118 located in the lower housing 110. The system 800 is then used in the same manner as with the process cathode assembly 802; where the chamber 804 is evacuated, the reactive gas is supplied to the valve 812, the RF energy excites the reactive gas into a plasma and the electromagnetic fields control the plasma. The diagnostic cathode 100, having its probes located where a wafer generally is located during processing, collects information, which is processed by the diagnostic circuitry 900 and then stored by a computer data acquisition system (not shown). Using this information, the plasma can be optimized for specific types of wafer processing.

Once the plasma diagnostics are complete the diagnostic cathode assembly 100 is removed from the chamber 804 and the process cathode 802 is installed. Thereafter, the system 800 is set up to process wafers using the optimized plasma.

Although various embodiments which incorporate the teachings of the present invention have been shown and described in detailed herein, those skilled in the art can readily devise many other varied embodiments that still incorporate these teachings.

What is claimed is:

1. A diagnostic pedestal assembly comprising:
    a pedestal containing an aperture within a surface; and
    a probe element, located within said aperture, having a probe tip that is exposed via said aperture.

2. The diagnostic pedestal assembly of claim 1 further comprising:
    a dielectric plug, located within said aperture, circumscribing the probe tip.

3. The diagnostic pedestal assembly of claim 2 wherein the dielectric plug has a surface that is coplanar with the probe tip and the surface of the pedestal.

4. The diagnostic pedestal assembly of claim 2 wherein said probe element has a first end and a second end and said diagnostic pedestal further comprises:
    a first insulating plate for supporting said dielectric plug, where said second end of said probe element passes through an aperture in said first insulating plate; and
    a second insulating plate for supporting said second end of said probe element.

5. The diagnostic pedestal assembly of claim 4 further comprising a cable routing pathway, defined by said first and second insulating plates, for routing a conductor coupled to said probe element.

6. The diagnostic pedestal assembly of claim 2 wherein said probe element has a first end and a second end, said diagnostic pedestal further comprises:
    a shielded coaxial cable having a center conductor and a shield, where the center conductor is connected at a first end to the second end of said probe element and connected at a second end to a signal pre-processing circuit, and the shield is coupled at a first end to the pedestal and coupled at a second end to a power supply that powers the pedestal.

7. The diagnostic pedestal assembly of claim 6 wherein the pre-processing circuit contains a low pass filter.

8. The diagnostic pedestal assembly of claim 1 wherein the probe tip of the probe element is coplanar with the surface of said pedestal.

9. The diagnostic pedestal assembly of claim 1 wherein said pedestal contains a plurality of apertures arranged in an array, where each aperture contains said probe element.

10. The diagnostic pedestal assembly of claim 9 further comprising:
    a dielectric plug, located within each of said apertures, circumscribing each of the probe tips, wherein each of said probe elements have a first end and a second end; and
    a plurality of shielded coaxial cables, each having a center conductor and a shield, where the center conductor of each coaxial cable is respectively connected at a first end to the second end of each of said probe elements and connected at a second end to a signal pre-processing circuit, and the shield of each coaxial cable is coupled at a first end to the pedestal and coupled at a second end to a power supply that powers the pedestal.

11. The diagnostic pedestal assembly of claim 10 wherein plurality of coaxial cables all have a same length.

12. The diagnostic pedestal assembly of claim 1 having a size and shape to replace a process pedestal assembly within a semiconductor wafer processing system.

13. The diagnostic pedestal assembly of claim 1 further comprising a cover, being of a same size and shape as a semiconductor wafer, positioned atop said pedestal, where said cover contains a cover aperture that is aligned with said probe tip.

14. The diagnostic pedestal assembly of claim 13 wherein said probe tip extends through said cover aperture.

15. A diagnostic cathode assembly comprising:
    a diagnostic pedestal assembly containing a pedestal defining a surface having an aperture therewithin, said pedestal further including a probe element, located within said aperture, where said probe element has a probe tip that is exposed via said aperture;
    a cooling plate, affixed to said diagnostic pedestal assembly, for cooling said pedestal;
    an electronics housing, mounted to said cooling plate, for shielding a signal pre-processing circuit.

16. The diagnostic cathode assembly of claim 15 having a size and shape that is substantially the same as a process cathode assembly, where said diagnostic cathode assembly replaces said process cathode assembly within a semiconductor wafer processing system.

17. The diagnostic cathode assembly of claim 15 wherein said diagnostic pedestal assembly further comprises a dielectric plug, located within said aperture, circumscribing the probe tip.

18. The diagnostic cathode assembly of claim 15 wherein said probe element has a first end and a second end and said diagnostic pedestal further comprises:
    a first insulating plate for supporting said dielectric plug, where said second end of said probe element passes through an aperture in said first insulating plate; and
    a second insulating plate for supporting said second end of said probe element.

19. The diagnostic cathode assembly of claim 18 further comprising a cable routing pathway, defined by said first and second insulating plates, for routing a conductor coupled to said probe element.

20. The diagnostic cathode assembly of claim 19 wherein said second insulating plate contains a cable routing extension, protruding through a hole in said cooling plate, having a bore that routes said cable.

21. The diagnostic cathode assembly of claim 20 further comprising:
    a shielded coaxial cable having a center conductor and a shield, where the center conductor is connected at a first end to the second end of said probe element and connected at a second end to said signal pre-processing circuit, and the shield is coupled at a first end to the pedestal and coupled at a second end to a power supply that powers the pedestal.

22. The diagnostic cathode assembly of claim 20 wherein the pre-processing circuit contains a low pass filter.

23. The diagnostic cathode assembly of claim 15 further comprising a cover, being of a same size and shape as a semiconductor wafer, positioned atop said pedestal, where said cover contains a cover aperture that is aligned with said probe tip.

24. The diagnostic cathode assembly of claim 23 wherein said probe tip extends through said cover aperture.

25. The diagnostic cathode assembly of claim 15 wherein said pedestal contains a plurality of apertures arranged in an array, where each aperture contains said probe element.

26. The diagnostic cathode assembly of claim 25 further comprising:
   a dielectric plug, located within each of said apertures, circumscribing each of the probe tips, where each of said probe elements have a first end and a second end; and
   a plurality of shielded coaxial cables, each having a center conductor and a shield, where the center conductor of each coaxial cable is respectively connected at a first end to the second end of each of said probe elements and connected at a second end to said signal pre-processing circuit, and the shield of each coaxial cable is coupled at a first end to the pedestal and coupled at a second end to a power supply that powers the pedestal.

27. The diagnostic pedestal assembly of claim 26 wherein plurality of coaxial cables all have the same length.

28. A system for processing semiconductor wafers comprising:
   a process chamber adapted to establish a plasma therewithin through an introduction of a process gas and an application of RF energy, where said process chamber contains a cathode assembly support; and
   two interchangeable cathode assemblies that are selectively coupled to said cathode assembly support, said two interchangeable cathode assemblies being a process cathode assembly for supporting a substrate with a surface thereof exposed to said plasma and a diagnostic cathode assembly having a size and shape that is substantially the same as a size and shape of the process cathode assembly, said diagnostic cathode assembly having a probe element, that is exposed to said plasma.

29. The system of claim 28 wherein said diagnostic cathode assembly further comprises:
   a diagnostic pedestal assembly containing a pedestal defining a surface having an aperture therewithin, said pedestal further including a probe element, located within said aperture, where said probe element has a probe tip that is exposed via said aperture;
   a cooling plate, affixed to said diagnostic pedestal assembly, for cooling said pedestal;
   an electronics housing, mounted to said cooling plate, for shielding a signal pre-processing circuit.

30. The system of claim 29 having a size and shape that is substantially the same as a process cathode assembly, where said diagnostic cathode assembly replaces said process cathode assembly within a semiconductor wafer processing system.

31. The system of claim 29 wherein said diagnostic pedestal assembly further comprises a dielectric plug, located within said aperture, circumscribing the probe tip.

32. The system of claim 29 wherein said probe element has a first end and a second end and said diagnostic pedestal further comprises:
   a first insulating plate for supporting said dielectric plug, where said second end of said probe element passes through an aperture in said first insulating plate; and
   a second insulating plate for supporting said second end of said probe element.

33. The system of claim 32 further comprising a cable routing pathway, defined by said first and second insulating plates, for routing a conductor coupled to said probe element.

34. The system of claim 33 wherein said second insulating plate contains a cable routing extension, protruding through a hole in said cooling plate, having a bore that routes said cable.

35. The system of claim 34 further comprising:
   a shielded coaxial cable having a center conductor and a shield, where the center conductor is connected at a first end to the second end of said probe element and connected at a second end to said signal pre-processing circuit, and the shield is coupled at a first end to the pedestal and coupled at a second end to a power supply that powers the pedestal.

36. The system of claim 35 wherein the pre-processing circuit contains a low pass filter.

37. The system of claim 29 further comprising a cover, being of the same size and shape as a semiconductor wafer, positioned atop said pedestal, where said cover contains a cover aperture that is aligned with said probe tip.

38. The system of claim 37 wherein said probe tip extends through said cover aperture.

39. The system of claim 29 wherein said pedestal contains a plurality of apertures arranged in an array, where each aperture contains said probe element.

40. The system of claim 39 further comprising:
   a dielectric plug, located within each of said apertures, circumscribing each of the probe tips, where each of said probe elements have a first end and a second end; and
   a plurality of shielded coaxial cables, each having a center conductor and a shield, where the center conductor of each coaxial cable is respectively connected at a first end to the second end of each of said probe elements and connected at a second end to said signal pre-processing circuit, and the shield of each coaxial cable is coupled at a first end to the pedestal and coupled at a second end to a power supply that powers the pedestal.

41. The system of claim 40 wherein plurality of coaxial cables all have the same length.

* * * * *

UNITED STATES PATENT AND TRADEMARK OFFICE
CERTIFICATE OF CORRECTION

PATENT NO. : 5,989,349
DATED : November 23, 1999
INVENTOR(S) : Kuang-Han Ke, Roger A. Lindley, Hongching Shan, Richard R. Mett It is certified that error appears in the above-identified patent and that said Letters Patent is hereby corrected as shown below:

claim 27: column 11, line 27 delete "the" and insert --a--;

claim 37: column 12, line 32 delete "the "and insert --a--;

claim 41: column 12, line 55 delete "the" and insert --a--.

Signed and Sealed this

Twenty-first Day of November, 2000

Attest:

Q. TODD DICKINSON

*Attesting Officer*      *Director of Patents and Trademarks*